United States Patent
Syu et al.

(10) Patent No.: US 9,348,741 B1
(45) Date of Patent: May 24, 2016

(54) SYSTEMS AND METHODS FOR HANDLING WRITE DATA ACCESS REQUESTS IN DATA STORAGE DEVICES

(75) Inventors: Mei-Man L. Syu, Fremont, CA (US); Robert L. Horn, Yorba Linda, CA (US); William B. Boyle, Lake Forest, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/330,250

(22) Filed: Dec. 19, 2011

(51) Int. Cl.
*G06F 12/08* (2006.01)
*G06F 12/02* (2006.01)

(52) U.S. Cl.
CPC ........................... *G06F 12/02* (2013.01)

(58) Field of Classification Search
CPC . G06F 11/08; G06F 11/1008; G06F 11/1076; G06F 11/1471; G06F 12/1072; G06F 12/126; G06F 13/00; G06F 17/30; G06F 2201/835; G06F 2212/7208; G06F 2212/7211; G06F 3/0601; G06F 3/0611; G06F 3/0644
See application file for complete search history.

(56) References Cited

U.S. PATENT DOCUMENTS

| | | | |
|---|---|---|---|
| 6,145,069 A | 11/2000 | Dye | |
| 6,839,801 B2 * | 1/2005 | Jaquette | ........................ 711/111 |
| 6,856,556 B1 | 2/2005 | Hajeck | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,925,796 B1 | 4/2011 | Bailey et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |

(Continued)

OTHER PUBLICATIONS

Roberts, D., Kgil, T., Mudge, T., "Using non-volatile memory to save energy in servers", Design, Automation & Test in Europe Conference & Exhibition, Apr. 24, 2009, pp. 743-748.

(Continued)

*Primary Examiner* — Mark Giardino, Jr.
*Assistant Examiner* — Mohamed Gebril

(57) ABSTRACT

Embodiments of the invention are directed to systems and methods for optimizing handling of data access requests. In one embodiment, a data storage device including non-volatile memory and magnetic media includes a controller that defers writing data to the magnetic media by first writing to the non-volatile memory and reporting to the host a write complete status. However, in cases where the non-volatile memory includes Multi-Level Cell (MLC) memory, if the write data is to be written to an upper page of an MLC cell, a backup power source such as a capacitor may be needed to avoid the paired page corruption problem. Embodiments of the invention avoid the problem without the use of a backup power source by writing deferred write data to a portion of the MLC memory that is operating in Single-Level Cell (SLC) mode, i.e., only the lower pages of the memory cells are written.

15 Claims, 3 Drawing Sheets

(56) References Cited

U.S. PATENT DOCUMENTS

| | | |
|---|---|---|
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,225,035 B2 * | 7/2012 | Colligan .................. 711/112 |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2008/0126680 A1 | 5/2008 | Lee et al. |
| 2008/0141100 A1 | 6/2008 | Kang et al. |
| 2008/0172520 A1 | 7/2008 | Lee |
| 2008/0228834 A1 | 9/2008 | Burchall et al. |
| 2008/0228998 A1 | 9/2008 | Colecchia et al. |
| 2008/0288436 A1 | 11/2008 | Priya N V |
| 2009/0138654 A1 * | 5/2009 | Sutardja ................ 711/103 |
| 2009/0300269 A1 * | 12/2009 | Radke et al. ........... 711/103 |
| 2010/0122016 A1 | 5/2010 | Marotta et al. |
| 2010/0174849 A1 | 7/2010 | Walston et al. |
| 2010/0226165 A1 | 9/2010 | Kang et al. |
| 2010/0246257 A1 | 9/2010 | Ito et al. |
| 2010/0250793 A1 | 9/2010 | Syu |
| 2010/0262755 A1 | 10/2010 | Becker et al. |
| 2010/0325351 A1 * | 12/2010 | Bennett ................. 711/103 |
| 2011/0099323 A1 | 4/2011 | Syu |
| 2011/0283049 A1 | 11/2011 | Kang et al. |
| 2011/0302477 A1 * | 12/2011 | Goss et al. ............ 714/773 |
| 2012/0089766 A1 * | 4/2012 | Yu et al. ................ 711/103 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0311293 A1 * | 12/2012 | Nemazie et al. ......... 711/171 |
| 2012/0324191 A1 | 12/2012 | Strange et al. |
| 2013/0132638 A1 * | 5/2013 | Horn et al. ............ 711/103 |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

OTHER PUBLICATIONS

Samsung, "4Gb Flex-OneNAND M-die", http://www.datasheetdir.com/KFH8GH6U4M+NAND-Flash, Aug. 22, 2007.

* cited by examiner

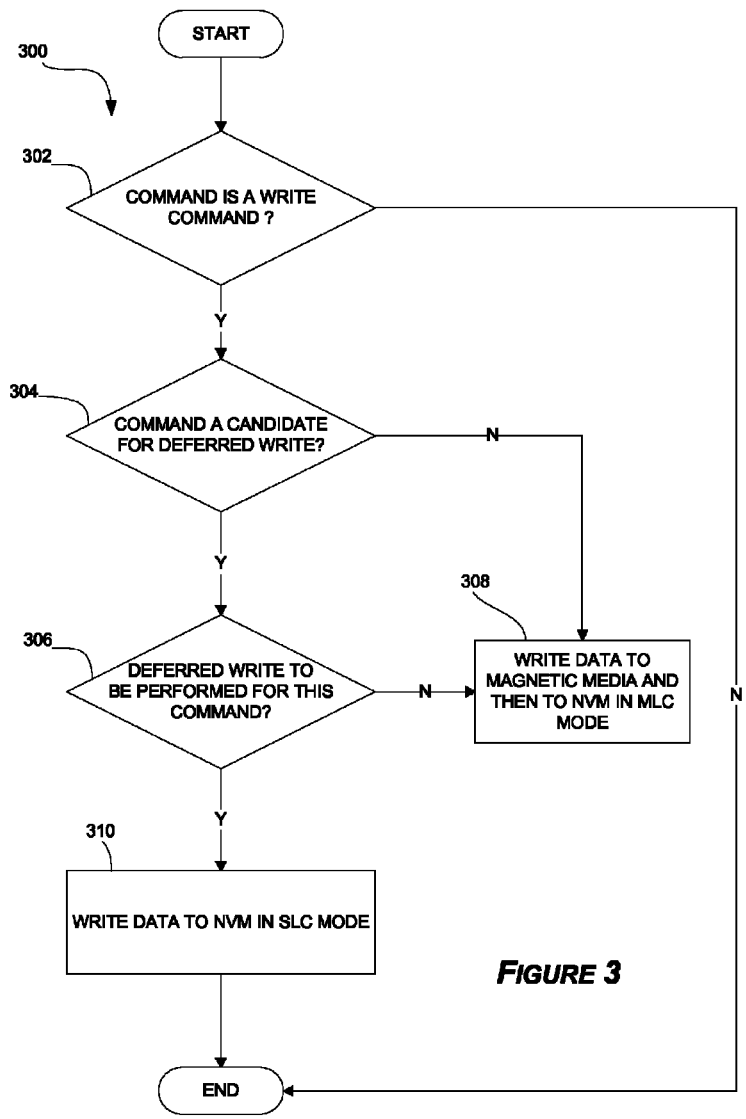

SYSTEMS AND METHODS FOR HANDLING WRITE DATA ACCESS REQUESTS IN DATA STORAGE DEVICES

BACKGROUND

1. Technical Field

This disclosure relates to handling write data access requests in data storage devices.

2. Description of Related Art

The performance of data storage systems such as solid-state semiconductor memory-based storage devices often depends on the efficiency of data access request handling. Many solid-state semiconductor memory storage devices such as NAND flash are increasingly being used in hybrid hard disks where NAND flash is paired with magnetic media. In many such applications, the controller needs to optimize the handling of data access requests to fully take advantage of the performance characteristics of each type of storage medium (NAND flash and magnetic media).

BRIEF DESCRIPTION OF THE DRAWINGS

Systems and methods which embody the various features of the invention will now be described with reference to the following drawings, in which:

FIG. 3 illustrates a process of handling deferred write commands according to an embodiment.

DETAILED DESCRIPTION

While certain embodiments of the inventions are described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

Overview

Embodiments of the invention are directed to systems and methods for optimizing handling of data access requests. In one embodiment, a data storage device including non-volatile memory and magnetic media includes a controller that defers writing data to the magnetic media by first writing to the non-volatile memory and reporting to the host a write complete status. However, in cases where the non-volatile memory includes Multi-Level Cell (MLC) memory, if the write data is to be written to an upper page of an MLC cell, a backup power source such as a capacitor may be needed to avoid the paired page corruption problem. Embodiments of the invention avoid the problem without the use of a backup power source by writing deferred write data to a portion of the MLC memory that is operating in Single-Level Cell (SLC) mode, i.e., only the lower pages of the memory cells are written.

As used in this application, "non-volatile memory" (NVM) typically refers to solid-state semiconductor memory such as NAND flash. As such, while certain internal operations are referred to which typically are associated with solid-state drives, such as "wear leveling" and "garbage collection," analogous operations for hard drives can also take advantage of this disclosure. Solid-state memory may comprise a wide variety of technologies, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), or other discrete NVM (non-volatile memory) chips. The solid-state storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

System Overview

Figure 1:
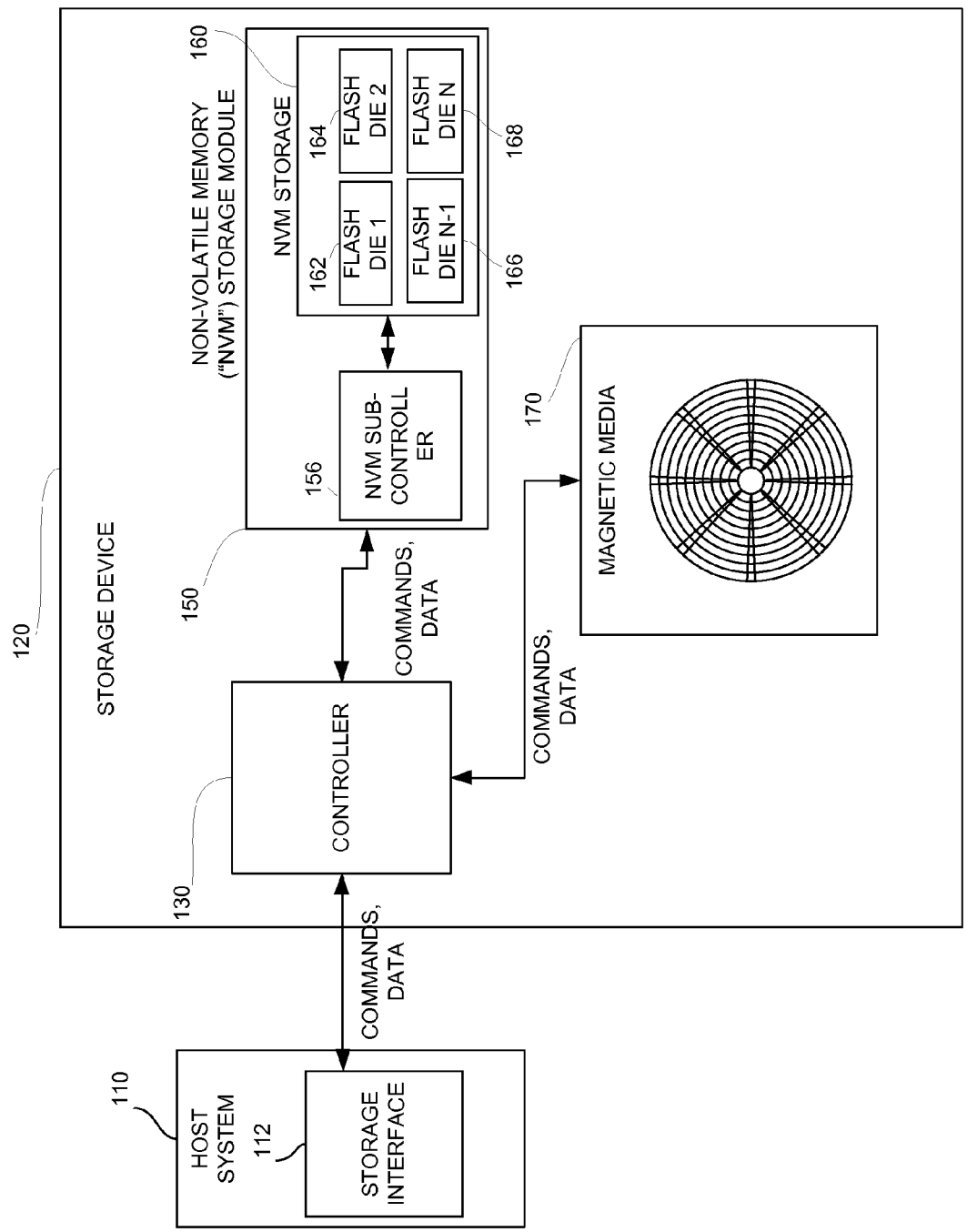
FIG. 1 illustrates an embodiment of a data storage device according to an embodiment.

Referring to FIG. 1, an embodiment of a data storage device 120 is shown in communication with a host system 110. The host system 110 can send data access commands through a variety of interfaces (e.g., storage interface 112) to the data storage device 120. In FIG. 1, the data storage device 120 as shown is a hybrid hard disk drive in one embodiment, which includes a controller 130, magnetic media 170, and a non-volatile memory (NVM) storage module 150. The NVM storage module 150 may in turn include one or more NVM storage array 160 with a plurality of flash dies 162-168, for example. The controller 130 may receive the data access commands from the host system 110 and determine how to fulfill those commands. Actions taken to fulfill those commands may include memory accesses to the NVM storage module 150 and/or magnetic media 170.

In one embodiment, the controller 130 fulfills many write commands from the host system 110 by writing data from the host system 110 to the magnetic media 170. However, the controller 130 from time to time may execute a "deferred write" operation in which data from the host system is written to the NVM storage module 150, and a command completion status is reported to the host system 110. This operation can be completed faster than writing to the magnetic media 170, especially when the magnetic media is spun down, and thus can enhance the overall performance of the data storage device 120 from the host system's perspective. As the name "deferred write" implies, the data written to the NVM storage module 150 may be later written to the magnetic media 170.

Paired Page Corruption

Figure 2A:
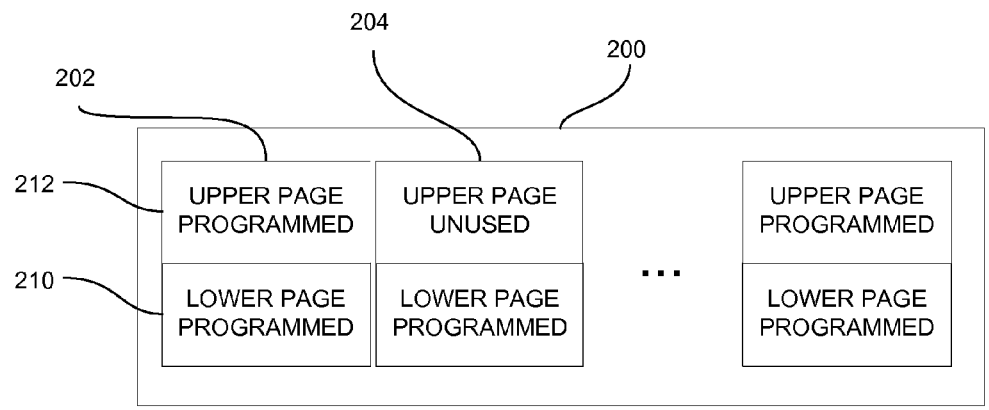
FIG. 2A illustrates a Multi-Level Cell (MLC) memory being programmed in both MLC and Single-Level Cell (SLC) modes according to an embodiment.

If a portion of the NVM storage module is utilizing MLC NAND chips, this deferred write operation needs to be protected from failure through the use of a backup power source. More specifically, the backup power source may be needed to complete outstanding writes to the MLC memory to prevent the so called "paired page corruption" problem. The problem can be illustrated by the example MLC memory 200 shown in FIG. 2A. Cell 202, for example, is programmed in MLC mode and both the cell's lower page (210) and upper page (212) are programmed. Because of the physical properties of MLC mode cell, its lower page must be programmed first, and then its upper page is programmed afterward. As an example, cell 204 only has the lowered page programmed.

Because the process of programming the upper page changes the cell's voltage, the data previously programmed in the lower page may be lost/corrupted if power is interrupted during the programming of the upper page. In particular, in order to program the upper page, the lower page needs to be temporarily transitioned to another programmed value, and then after the upper page is programmed, the lower page is transitioned back to the original value. If this process is interrupted, data in that the lower page, which could have been programmed a long time ago, could be lost. A data integrity problem arises if that lower page contains data programmed by a previous deferred write operation, which means that there may not be a back-up copy already written to the magnetic media.

To prevent the paired page corruption problem discussed above, the NVM storage module 150 may include a capacitor as a backup power source that allows the completion of upper page programming operations in MLC memory in the event of a power interruption. However, the introduction of a capacitor power source may drive up production costs of the overall data storage device 120. In addition, as many data storage devices are being produced in small physical form factors, there may not be enough room in the storage devices to accommodate such capacitors.

Handling Deferred Write Commands

Thus, embodiments of the invention are directed at reducing the need of such a backup power source by selectively programming certain MLC cells in the lower/lowest page only, i.e., using the cells as SLC cells or in an SLC mode. Writing to lower/lowest pages only avoids the problem because if a deferred write operation to the lower/lowest page of an MLC cell is interrupted by a power loss event, a completion status is not returned to the host system.

In one embodiment, the controller 130 is configured to perform the process 300 depicted in FIG. 3 in handling write commands. The example process 300 begins at block 302, where the controller determines whether a data access command is a write command. If not, the special handling process terminates and the controller moves on to handle the command according to other programmed routines/processes. Otherwise, if the incoming command is a write command, the process 300 moves to block 304, where the controller determines whether the command is a candidate for deferred write. This determination may hinge on a number of factors, including: whether the write data is part of a random write or a sequential write, whether the data is frequently accessed data, whether the magnetic media is spun down, etc. For example, a random write may be a good candidate for deferred write because of the improved performance of NVM over magnetic media in random writes. Likewise, copy of some frequently read data (e.g., a certain LBA range) may be promoted from the magnetic media to the NVM for faster access. Thus a new command writing to such a LBA range may be a good candidate for a deferred write because the new data will be stored in the NVM and immediately available for read accesses.

If it is determined that the write command is a good candidate for a deferred write, the process moves to block 306 where the controller checks to determine whether a deferred write should be performed for this command. Block 306 provides a check against operating conditions that may prevent the execution of a deferred write. For example, if the NVM is close to the end of its remaining useful life, to minimize the risk of data loss, the controller may elect to not perform a deferred write to the NVM. In another example, a portion of the NVM reserved for deferred write data may be full or close to reaching its full capacity, in which case the deferred write would not be executed. If these blocking conditions are absent and the controller determines that the deferred write should be executed, the controller moves onto to block 310 and writes the deferred write data in SLC mode. In any case, if deferred write is not performed, the write data is written first to the magnetic media (disk) and then to the NAND in MLC mode (block 308). After both operations are completed, a complete status is reported to the host. In one embodiment, a non-deferred write operation may write to the magnetic media only.

Figure 2B:
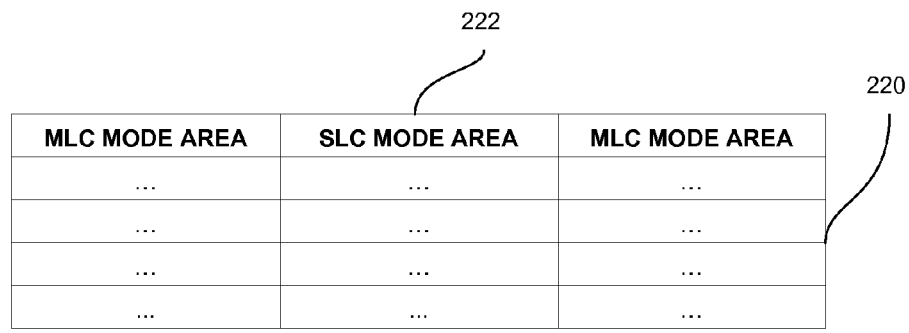
FIG. 2B illustrates a MLC memory being divided into MLC and SLC mode portions according to an embodiment.

As discussed above, writing in SLC mode utilizes the lower pages of multiple-page cells. Therefore, a significant percentage (e.g., 50% in a two-bit MLC memory) of the memory capacity is left un-used. Thus, embodiments of the invention provide a trade-off between (1) reduced cost gained from the elimination of the need for backup power (e.g., in the form of capacitors) and (2) reduced NVM capacity. Thus, in one embodiment, a portion of the NVM module is reserved for this purpose, as shown in FIG. 2B, where NVM 220 is divided into portions or areas with at least one portion/area 222 reserved for deferred write in SLC mode. For example, in one embodiment, 1 GB out of 16 GB of an NVM can be reserved for this purpose. In one embodiment, the reserved amount could be dynamically adjusted in operation to accommodate the volume of deferred writes experienced by the data storage device.

CONCLUSION

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual steps taken in the processes shown in FIG. 3 may differ from those shown in the figures. Depending on the embodiment, certain of the steps described in the example above may be removed, others may be added, and the sequence of steps may be altered and/or performed in parallel. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of writing data in a data storage device comprising magnetic media and solid-state semiconductor memory with a plurality of multi-level cells, the method comprising:

reserving a portion of the plurality of multi-level cells as a reserved portion to be operated in a single-level cell mode, the reserved portion comprising one or more multi-level cells of the plurality of multi-level cells;

receiving a write command with write data;

determining whether the write command is a candidate for a deferred write operation in which the write data is to be first written to the solid-state semiconductor memory and subsequently written to the magnetic media, the determination based at least in part on (i) a frequency of reading a logical address associated with the write command, and (ii) a spin state of the magnetic media;

in response to determining that the write command is a candidate for the deferred write operation, causing the write data to be first written in one or more multi-level cells of the reserved portion operating in the single-level cell mode and causing the write data written in the reserved portion operating in the single-level cell mode to be subsequently written to the magnetic media; and adjusting a size of the reserved portion operating in the single-level cell mode based on a number of write commands determined to be candidates for the deferred write operation with write data to be written in the reserved portion, wherein the adjusted size of the reserved portion is selected to accommodate the write data associated with the number of write commands in the reserved portion.

2. The method of claim 1, wherein the determination is further based at least in part on one or more of:
   whether the solid-state semiconductor memory is near the end of its useful life; or
   whether an area of the solid-state semiconductor memory reserved for deferred write operations is full.

3. The method of claim 1, wherein the determination is further based at least in part on whether the write data should be first written to the solid-state semiconductor memory before being written to the magnetic media.

4. The method of claim 1, wherein the size of the reserved portion is dynamically adjusted based on the number of deferred write operations while the data storage device is in operation.

5. A data storage device comprising:
   magnetic media;
   solid-state semiconductor memory with a plurality of multi-level cells; and
   a controller configured to:
      reserve a portion of the plurality of multi-level cells as a reserved portion to be operated in a single-level cell mode, the reserved portion comprising one or more multi-level cells of the plurality of multi-level cells;
      receive a write command with write data;
      determine whether the write command is a candidate for a deferred write operation in which the write data is to be first written to the solid-state semiconductor memory and subsequently written to the magnetic media, the determination based at least in part on (i) metadata associated with the write command, and (ii) a spin state of the magnetic media;
      in response to determining that the write command is a candidate for the deferred write operation, cause the write data to be written in one or more multi-level cells of the reserved portion operating in the single-level cell mode and cause the write data written in the reserved portion operating in the single-level cell mode to be subsequently written to the magnetic media; and
      adjust a size of the reserved portion operating in the single-level cell mode based on a number of write commands determined to be candidates for the deferred write operation with write data to be written in the reserved portion, wherein the adjusted size of the reserved portion is selected to accommodate the write data associated with the number of write commands in the reserved portion.

6. The data storage device of claim 5, wherein the determination is further based at least in part on one or more of:
   whether the solid-state semiconductor memory is near the end of its useful life;
   whether the write data is frequently accessed; or
   whether an area of the solid-state semiconductor memory reserved for deferred write operations is full.

7. The data storage device of claim 5, wherein the determination is further based at least in part on whether the write data should be first written to the solid-state semiconductor memory before being written to the magnetic media.

8. The data storage device of claim 5, wherein the size of the reserved portion is dynamically adjusted based on the number of deferred write operations while the data storage device is in operation.

9. The data storage device of claim 5, wherein the metadata identifies one or more of the following:
   whether the write command is associated with a random write;
   whether the write command is associated with a sequential write; or
   a frequency of access of the write data.

10. A method of writing data in a data storage device comprising magnetic media and solid-state semiconductor memory with a plurality of multi-level cells, the method comprising:
   reserving a portion of the plurality of multi-level cells as a reserved portion to be operated in a single-level cell mode, the reserved portion comprising one or more multi-level cells of the plurality of multi-level cells;
   receiving a write command with write data;
   determining whether the write command is a candidate for a deferred write operation based at least in part on a spin state of the magnetic media;
   in response to determining that the write command is a candidate for the deferred write operation, causing the write data to be written in one or more multi-level cells of the reserved portion operating in the single-level cell mode and causing the write data written in the reserved portion operating in the single-level cell mode to be subsequently written to the magnetic media; and
   adjusting a size of the reserved portion operating in the single-level cell mode based on a number of write commands determined to be candidates for the deferred write operation with write data to be written in the reserved portion, wherein the adjusted size of the reserved portion is selected to accommodate the write data associated with the number of write commands in the reserved portion,
   wherein the deferred write operation comprises:
      writing the write data to the solid-state semiconductor memory; and
      subsequently writing the write data to the magnetic media.

11. The method of claim 10, wherein the determination is further based at least in part on one or more of:
   whether the solid-state semiconductor memory is near the end of its useful life;
   whether the write data is frequently accessed; or
   whether an area of the solid-state semiconductor memory reserved for deferred write operations is full.

12. The method of claim 10, wherein the determination is based at least in part on whether the write data should be first written to the solid-state semiconductor memory before being written to the magnetic media.

13. The method of claim 10, wherein the size of the reserved portion is dynamically adjusted while the data storage device is in operation.

14. The data storage device of claim 5, wherein the controller is configured to perform the determination based at least in part on a frequency of reading a logical address associated with the write command.

15. The method of claim 10, wherein the determining is performed based at least in part on a frequency of reading a logical address associated with the write command.

* * * * *